United States Patent
Lapstun

(10) Patent No.: US 7,675,021 B2
(45) Date of Patent: Mar. 9, 2010

(54) TWO DIMENSIONAL CONTACT IMAGE SENSOR WITH FRONTLIGHTING

(75) Inventor: Paul Lapstun, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 0 days.

(21) Appl. No.: 12/178,636

(22) Filed: Jul. 24, 2008

(65) Prior Publication Data

US 2009/0032687 A1 Feb. 5, 2009

Related U.S. Application Data

(60) Provisional application No. 60/953,443, filed on Aug. 1, 2007, provisional application No. 60/974,077, filed on Sep. 21, 2007.

(51) Int. Cl.
*H04N 1/04* (2006.01)

(52) U.S. Cl. .................... 250/221; 250/461.1

(58) Field of Classification Search ............. 250/208.1, 250/226, 330, 332, 334, 221; 235/462.42; 358/509, 510, 475, 480; 340/5.53, 5.83
See application file for complete search history.

(56) References Cited

U.S. PATENT DOCUMENTS

| | | | |
|---|---|---|---|
| 4,189,753 A | 2/1980 | Parsons et al. | |
| 4,864,618 A | 9/1989 | Wright et al. | |
| 5,051,736 A | 9/1991 | Bennett et al. | |
| 5,446,290 A | 8/1995 | Fujieda et al. | |
| 5,477,012 A | 12/1995 | Sekendur | |
| 5,652,412 A | 7/1997 | Lazzouni et al. | |
| 5,661,506 A | 8/1997 | Lazzouni et al. | |
| 5,692,073 A | 11/1997 | Cass | |
| 5,852,434 A | 12/1998 | Sekendur | |
| 6,076,734 A | 6/2000 | Dougherty et al. | |
| 6,504,143 B2* | 1/2003 | Koops et al. | 250/221 |
| 6,964,374 B1 | 11/2005 | Djuknic et al. | |
| 7,057,777 B2* | 6/2006 | Fang et al. | 358/475 |
| 2004/0188639 A1* | 9/2004 | Masuda et al. | 250/552 |

FOREIGN PATENT DOCUMENTS

| | | |
|---|---|---|
| EP | 1801750 A1 | 6/2007 |
| GB | 2306669 A | 5/1997 |
| JP | 08-055975 A | 2/1996 |
| WO | WO 99/18487 A2 | 4/1999 |
| WO | WO 99/50787 A1 | 10/1999 |

OTHER PUBLICATIONS

Dymetman, M., and Copperman, M., "Intelligent Paper in Electronic Publishing, Artist Imaging, and Digital Typography, Proceedings of EP '98", Mar./Apr. 1993, Springer Verlag LNCS 1375, pp. 392-406.

* cited by examiner

*Primary Examiner*—Georgia Y Epps
*Assistant Examiner*—Tony Ko

(57) ABSTRACT

A two-dimensional image sensor is disclosed. The image sensor includes an array of photodetectors directed towards a first side. Emitters directed towards the first side are also provided, with the emitters emitting infrared light when illuminated by ultraviolet light. An ultraviolet light source is provided for illuminating the emitters, and a filter prevents ultraviolet light from illuminating the photodetectors.

9 Claims, 3 Drawing Sheets ated Sep. 21, 2007 and U.S. Provi-

TWO DIMENSIONAL CONTACT IMAGE SENSOR WITH FRONTLIGHTING

CROSS-REFERENCE TO RELATED PATENT APPLICATIONS

The present application claims the right of priority under 35 U.S.C. § 119(e) based on U.S. Provisional Patent Application No. 60/974,077, filed Sep. 21, 2007 and U.S. Provisional Patent Application No. 60/953,443, filed Aug. 1, 2007, which are incorporated by reference herein in its entirety as if fully set forth herein.

FIELD OF THE INVENTION

The present invention relates generally to image sensors and, in particular, to a self-illuminating image sensor being able to be in contacting with a surface to be scanned.

CO-PENDING APPLICATIONS

The following applications have been filed by the Applicant simultaneously with the present application:

| | | | | |
|---|---|---|---|---|
| 12/178,611 | 12/178,612 | 12/178,614 | 12/178,616 | 12/178,619 |
| 12/178,622 | 12/178,624 | 12/178,626 | 12/178,629 | 12/178,631 |
| 12/178,638 | 12/178,610 | 12/178,613 | 12/178,615 | 12/178,617 |
| 12/178,618 | 12/178,620 | 12/178,621 | 12/178,623 | 12/178,634 |
| 12/178,641 | 12/178,642 | 12/178,637 | 12/178,639 | 12/178,640 |
| 12/178,625 | 12/178,627 | 12/178,628 | 12/178,630 | 12/178,632 |
| 12/178,633 | 12/178,635 | | | |

The disclosures of these co-pending applications are incorporated herein by reference.

CROSS REFERENCES

The following patents or patent applications filed by the applicant or assignee of the present invention are hereby incorporated by cross-reference.

| | | | | |
|---|---|---|---|---|
| 10/815,621 | 10/815,635 | 7,357,323 | 11/488,162 | 10/815,636 |
| 7,506,168 | 11/041,609 | 7,457,961 | 7,457,007 | 6,902,255 |
| 7,204,941 | 7,278,727 | 7,423,145 | 7,122,076 | 7,148,345 |
| 7,416,280 | 6,755,509 | 7,156,289 | 09/575,197 | 6,720,985 |
| 7,295,839 | 09/722,174 | 7,068,382 | 7,094,910 | 7,062,651 |
| 6,644,642 | 6,549,935 | 6,987,573 | 6,727,996 | 6,760,119 |
| 7,064,851 | 6,290,349 | 6,428,155 | 6,785,016 | 6,831,682 |
| 6,741,871 | 6,965,439 | 10/932,044 | 6,870,966 | 6,474,888 |
| 6,724,374 | 6,788,982 | 7,263,270 | 6,788,293 | 6,737,591 |
| 7,369,265 | 10/778,056 | 10/778,061 | 11/193,482 | 7,055,739 |
| 6,830,196 | 7,182,247 | 7,082,562 | 7,108,192 | 12/025,746 |
| 12/025,762 | 12/025,765 | 10/492,169 | 7,469,062 | 7,359,551 |
| 7,444,021 | 7,308,148 | 6,957,768 | 7,170,499 | 11/856,061 |
| 11/672,522 | 11/672,950 | 11/754,310 | 12/015,507 | |

BACKGROUND

A number of applications exist where an image sensor is used to scan a surface. In many such applications it is advantageous for the image sensor to be close to, or in contact with the surface.

Prior art image sensors that are close to, or in contact with the surface are typically one-dimensional. The reason for using a one-dimensional photodetector array in such image sensors is to allow the surface to be illuminated from a light source parallel to the photodetector array. In order to obtain a two-dimensional image of the surface, the surface and the photodetector array are moved relative to each other.

Applications also exist where the surface is coded using densely spaced dot patterns. The dots patterns typically encode at least a position on the surface.

One such a pattern uses dots spaced 120 microns apart. In order to achieve a minimum sampling rate of two, an image sensor is needed with a photodetector size of 60 microns, or minimum resolution of 423 pixels per inch (ppi). The dot patterns are two-dimensional patterns, and in one specific case each pattern has an extent of 100 pixels by 100 pixels.

As the two-dimensional extent of the image sensor increases to match that of the pattern to be sensed, providing illumination for the surface becomes increasingly difficult. In particular, the image sensor typically blocks light from reaching the surface underneath the centre regions of the sensor. A typical solution is to space the sensor away from the surface, but such a solution introduces further problems with regards to focussing the sensor.

A need thus exists for a two-dimensional image sensor which is as thin as possible, which has a field of view sufficient to sense at least one full dot pattern, and is self-illuminating.

SUMMARY

It is an object of the present invention to substantially overcome, or at least ameliorate, one or more disadvantages of existing arrangements.

According to a first aspect of the present disclosure, there is provided an image sensor comprising:
 a silicon substrate;
 an array of photodetectors formed within said silicon substrate; and
 channels etched through said silicon substrate for allowing light to pass through said substrate to a surface,
 wherein said array of photodetectors is arranged to detect reflections of light from said surface.

According to a second aspect of the present disclosure, there is provided an image sensor comprising:
 an array of photodetectors; and
 a light source arranged on a first side of said array of photodetectors for emitting light through said array of photodetectors and at least onto a surface on a second side of said array of photodetectors,
 wherein said array of photodetectors is arranged to detect reflections of light from said surface.

According to yet another aspect of the present disclosure, there is provided an image sensor comprising:
 an array of photodetectors directed towards a first side of said array of photodetectors;
 one or more emitters directed towards said first side of said array of photodetectors, said one or more emitters emitting light of a first wavelength when illuminated by light of a second wavelength;
 a light source for illuminating said one or more emitters, said light source emitting light of said second wavelength; and
 a filter for preventing light of said second wavelength from illuminating said photodetectors.

Other aspects of the invention are also disclosed.

Optionally, the image sensor further comprising a spacer for spacing said array of photodetectors from said surface.

Optionally, the image sensor further comprising a diffuser on a first side of said array of photodetectors, wherein a light source is associated with said diffuser to light said diffuser internally, and light leaking from said diffuser passes through said substrate to said surface.

Optionally, said channels have reflective side walls.

Optionally, the image sensor further comprising an aperture and lens associated with each photodetector for controlling a field of view of each photodetector.

Optionally, said spacer is an at least partially opaque planar layer between said array of photodetectors and said surface, said at least partially opaque planar layer having first pathways corresponding to said channels for allowing light that passed through said channels to pass to said surface, and second pathways corresponding to said photodetectors for allowing light to pass from said surface to said photodetectors.

Optionally, the image sensor further comprising a reflective layer associated with said diffuser for directing light towards said array of photodetectors.

In another aspect the present invention provides an image sensor comprising:

an array of photodetectors; and a light source arranged on a first side of said array of photodetectors for emitting light through said array of photodetectors and at least onto a surface on a second side of said array of photodetectors, wherein said array of photodetectors is arranged to detect reflections of light from said surface.

Optionally, the image sensor further comprising a spacer arranged on the second side of said array of photodetectors for spacing said array of photodetectors from said surface.

Optionally, the image sensor further comprising a diffuser on said first side of said array of photodetectors, wherein said light source is associated with said diffuser to light said diffuser internally, and light leaking from said diffuser passes through said array of photodetectors.

Optionally, the image sensor further comprising opaque covers for preventing light emitted from said diffuser from illuminating said array of photodetectors.

Optionally, said array of photodetectors is manufactured from a silicon wafer and a bulk of said silicon wafer forms said opaque covers.

Optionally, said array of photodetectors is manufactured from a silicon wafer and a bulk of said silicon wafer comprises etched channels allowing light to pass from said first side of said array of photodetectors.

Optionally, said channels have reflective side walls.

Optionally, the image sensor further comprising an aperture and lens associated with each photodetector for controlling a field of view of each photodetector.

Optionally, the image sensor further comprising a spacer arranged on the second side of said array of photodetector for spacing said array of photodetectors from said surface, said spacer being an at least partially opaque planar layer having first pathways corresponding to said channels for allowing light to pass from said first side to said surface, and second pathways corresponding to said photodetectors for allowing light to pass from said surface to said photodetectors.

Optionally, the image sensor further comprising a reflective layer associated with said diffuser for directing light towards said array of photodetectors.

Optionally, the image sensor further comprising:

a second array of photodetectors arranged in association with said array of photodetectors, said second array of photodetectors sensing scattered photons; and means for altering signals from said array of photodetectors based upon signals from said second array of photodetectors.

Optionally, said one or more emitters are interleaved with said photodetectors.

Optionally, said filter is arranged in a layer between said array of photodetectors and said one or more emitters.

Optionally, the image sensor further comprising a second filter for preventing light of said second wavelength from illuminating a surface on said first side of said array of photodetectors, wherein said array of photodetectors is arranged to detect reflections of light from said surface.

Optionally, the image sensor further comprising a transparent layer between said filters for directing light from said light source to said one or more emitters.

Optionally, said transparent layer acts as a spacer for spacing said array of photodetectors from said surface.

Optionally, the image sensor further comprising opaque covers for preventing light emitted from said one or more emitters from illuminating said array of photodetectors.

Optionally, said one or more emitters are printed on said filter and directed towards said first side of said array of photodetectors.

Optionally, light of said first wavelength is Infrared light, and light of said second wavelength is Ultraviolet light.

BRIEF DESCRIPTION OF THE DRAWINGS

One or more embodiments of the present invention will now be described with reference to the drawings, in which.

DETAILED DESCRIPTION

Figure 1:
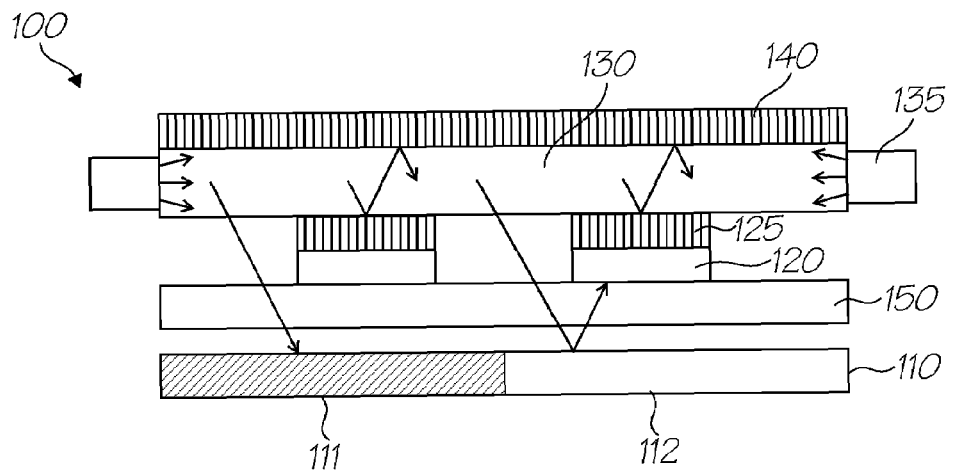
FIG. 1 shows a cross-sectional view of a two-dimensional image sensor having a back light.

Where reference is made in any one or more of the accompanying drawings to features which have the same reference numerals, those features have for the purposes of this description the same function(s), unless the contrary intention appears.

FIG. 1 shows a cross-sectional view of a two-dimensional image sensor 100 having a back light. The image sensor 100 includes an array of photodetectors 120, also known as photodiodes or pixel sensors, with each photodetector 120 providing a signal based upon an amount of illumination sensed by the photodetector 120. For ease of illustration the image sensor 100 shown includes only 2 columns of photodetectors 120, but those skilled in the present art would understand that the number of photodetectors 120 included in the image sensor 100 is determined by its application.

The image sensor 100 is further provided with a spacer 150 arranged underneath the array of photodetectors 120 for spacing the photodetectors 120 from an underlying surface 110. In the preferred implementation the spacer 150 is a transparent layer.

The backlight of the image sensor 100 is provided by a diffusively transmissive medium 130 attached above the array of photodetectors 120. The diffusively transmissive medium 130 is lit by one or more Light Emitting Diodes (LEDs) 135 arranged along one or more edges of the diffusively transmissive medium 130. The light emitted by the LEDs 135 reflects within the transmissive medium 130, carrying the light throughout the transmissive medium 130. Some of the light leaks out along the planar surfaces of the diffusively transmissive medium 130. To prevent the light from leaking upwards (away from the underlying surface 110), the diffusively transmissive medium 130 is provided with a reflective layer 140 on the upper planar surface of the diffusively transmissive medium 130. The reflective layer 140 reflects light back towards the array of photodetectors 120 and the underlying surface 110.

Each photodetector 120 is also provided with a cap 125 for shielding the photodetector 120 from being illuminated with light emitted directly from the diffusively transmissive medium 130. In this manner, the photodetectors 120 are only responsive to light reflected by the underlying surface 110.

Figure 2:
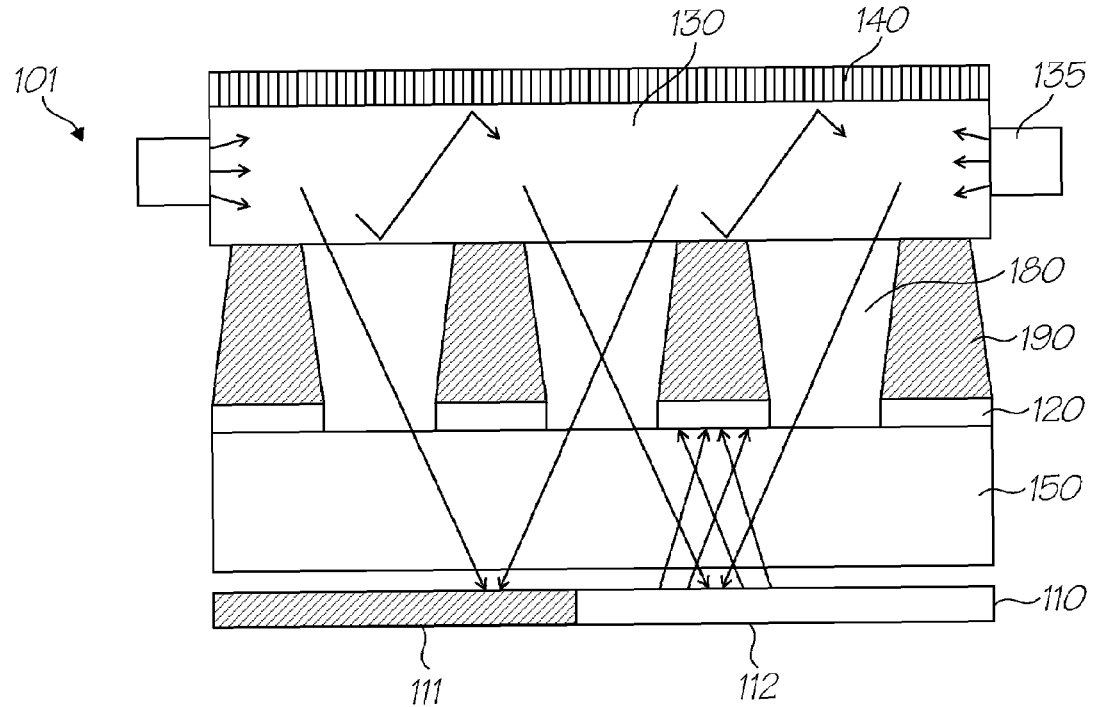
FIG. 2 shows a cross-sectional view of a two-dimensional image sensor having a back light where the array of photodetectors is fabricated in a silicon wafer.

FIG. 2 shows a cross-sectional view of a two-dimensional image sensor 101 having a backlight where the array of photodetectors 120 is fabricated in a silicon wafer. In this implementation the bulk 190 of the silicon wafer acts as the caps 125 (FIG. 1), shielding the photodetector 120 from being illuminated directly from the diffusively transmissive medium 130.

Figure 3:
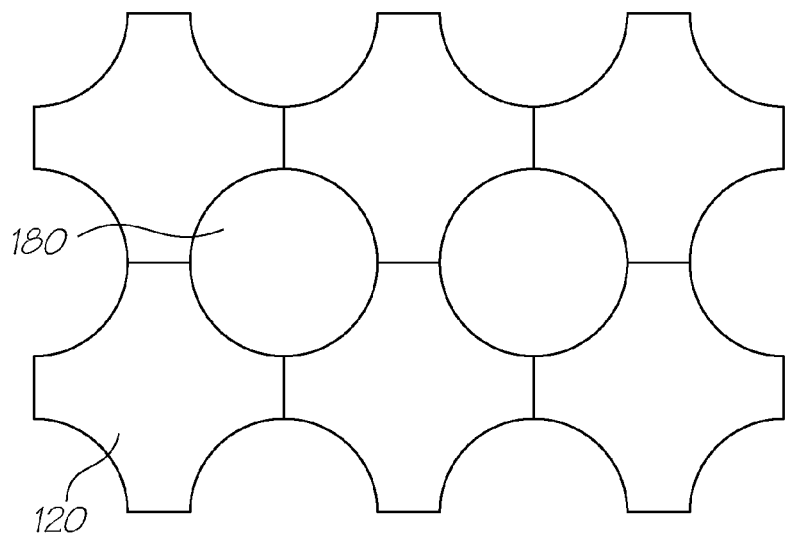
FIG. 3 shows a plan view of the silicon wafer of the two-dimensional image sensor shown in FIG. 2.

FIG. 3 shows a plan view of the silicon wafer of the two-dimensional image sensor 101 shown in FIG. 2. Referring to FIGS. 2 and 3, channels 180 are etched through the silicon wafer to allow light to pass from the diffusively transmissive medium 130 towards the underlying surface 110. In a preferred implementation the sidewalls of the etched channels 180 are made reflective, allow the channels to partially act as light pipes.

Referring again to FIGS. 1 and 2, light escaping from the diffusively transmissive medium 130 passes past the photodetectors 120, passes through the transparent layer 150, and onto the underlying surface 110. The underlying surface 110 has light absorbing regions 111 and light reflective regions 112. The light absorbing regions 111 absorb light, whereas the light reflective regions 112 reflect light illuminating that region. As the underlying surface 110 slightly scatters light, one or more photodetectors 120 located above light reflective regions 112 senses the illumination, and provide a corresponding signal.

Since the distance from the photodetectors 120 to the underlying surface 110, defined by the thickness of the transparent layer 150, is significantly larger than the area of an individual photodetector 120, in one implementation (not illustrated) of the image sensor each photodetector 120 is provided with an aperture and a lens. The aperture and lens restricts the field of view of the photodetectors 120, thereby minimising blurring of the "image" captured by the image sensor.

In a further implementation (not illustrated) blurring is minimised by decreasing the area of the photodetectors 120, and surrounding each photodetector 120 by a further photodetector, for example in a concentric cylindrical fashion. The further photodetectors sense scattered photons, and the output signal of photodetector 120 is altered based upon the signal output by the further photodetector associated with the photodetector 120.

In yet another implementation (not illustrated) blurring is minimised by using a layer of silicon is spacer 150. The layer of silicon has both illumination and photodetector light channels etched through it. Referring to FIG. 2, channels or pathways corresponding to the channels 180 are provided for allowing light to pass from the diffusively transmissive medium 130 to the underlying surface 110, as well as channels or pathways corresponding to the photodetectors 120 for allowing light to pass from the underlying surface 110 to said photodetectors 120.

In yet another implementation (not illustrated), to avoid the need for back etching to allow backlighting, the emission layer(s) and transparent anode of a large-area IR OLED can be deposited onto the surface of the entire image sensor, using a metal mask as the cathode.

Figure 4:
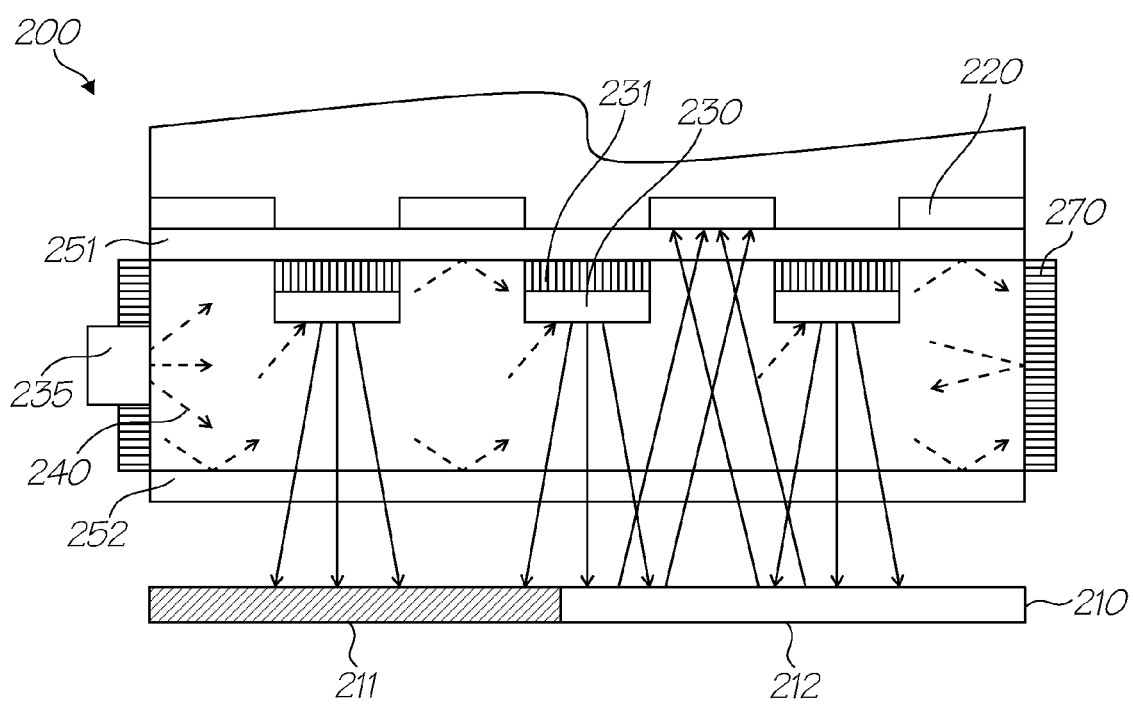
FIG. 4 shows a cross-sectional view of a two-dimensional image sensor having a front light.

FIG. 4 shows a cross-sectional view of a two-dimensional image sensor 200 having a front light. Image sensor 200 also includes an array of photodetectors 220 for providing signals based upon an amount of illumination received by respective photodetectors 220.

Figure 5:
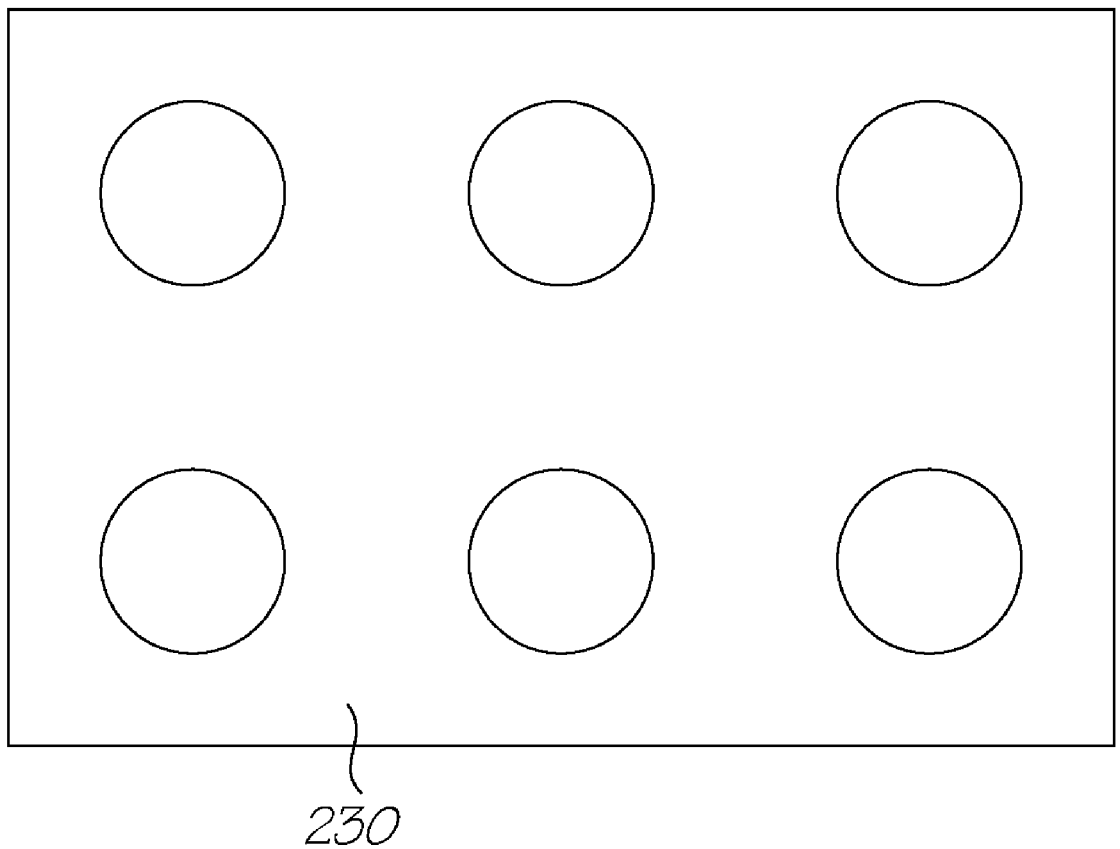
FIG. 5 shows a plan view of the image sensor 200 shown in FIG. 4.

The front light of the image sensor 200 is provided by Ultraviolet-stimulated (UV-stimulated) fluorescent (or phosphorescent) Infrared (IR) emitter 230. Emitter 230 operates by releasing IR illumination when the emitter 230 is illuminated with UV light. FIG. 5 shows a plan view of the image sensor 200 shown in FIG. 4 illustrating the spatial relationship of apertures in the emitter 230 for allowing light to pass to the photodetectors 220. Referring again to FIG. 5, the emitter 230 is arranged below the array of photodetectors 220 and faces an underlying surface 210 through a UV integration layer 240. The UV integration layer 240 is lit by one or more UV LEDs 235 arranged along one or more edges of the UV integration layer 240.

A UV filter 251 is provided between the array of photodetectors 220 and the UV integration layer 240 to prevent the photodetectors 220 from being illuminated by UV light from the UV LEDs 235, as well as UV light reflected within the UV integration layer 240. A second UV filter 252 is provided on the lower planar surface of the UV integration layer 240. The UV filters 251 and 252 prevent UV light from escaping the UV integration layer 240, causing the UV light emitted by the UV LEDs 235 to reflect within the UV integration layer 240. Reflectors 270 may also be provided at the edges of the UV integration layer 240 to further prevent UV light from escaping the UV integration layer 240.

The emitter 230 absorbs UV light and emits IR light. The emitter 230 is provided with a cap 231 for preventing IR light emitted by the emitter 230 from directly illuminating the photodetectors 220. Instead, the IR light emitted by the emitter 230 passes through the UV integration layer 240, through the lower UV filter 252 and towards the underlying surface 210.

The underlying surface 210 has IR light absorbing regions 211 and IR light reflective regions 212. IR light reflected by IR reflective regions 212 passes through UV filter 252, through UV integration layer 240, through UV filter 251 and onto the photodetectors 220. One or more photodetectors 220 located above IR light reflective region 212 senses the IR illumination, and provide a corresponding signal.

The field of view of each photodetector 220 may be reduced by reducing the size of the apertures provided in the emitter 230 and/or by increasing the distance from the emitter layer to the photodetector layer, e.g. by increasing the thickness of UV filter 251 and/or the caps 231.

In the preferred implementation the IR emitter 230 is deposited directly onto the 1st UV filter 251, for example by printing. More particularly, an IR-reflective (or IR-absorptive) cap layer 231 is first deposited, followed by the IR emitter 230 itself.

Although described in terms of UV-IR fluorescence, the front light may use any suitable IR fluorescence or phosphorescence.

In an alternative implementation of the image sensor 200, the lower UV filter 252 is absent. In that case the underlying surface 210 is provided with UV-stimulated fluorescent (or phosphorescent) IR ink.

The foregoing describes only some embodiments of the present invention, and modifications and/or changes can be made thereto without departing from the scope and spirit of the invention, the embodiments being illustrative and not restrictive.

I claim:

1. An image sensor comprising:
   a planar array of photodetectors directed towards a first side of said array of photodetectors;
   one or more emitters directed towards said first side of said planar array of photodetectors, said one or more emitters emitting light of a first wavelength when illuminated by light of a second wavelength, said first and second wavelengths being different;
   a light source for illuminating said one or more emitters, said light source emitting light of said second wavelength; and
   a filter for preventing light of said second wavelength from illuminating said photodetectors.

2. The image sensor according to claim 1 wherein said one or more emitters are interleaved with said photodetectors.

3. The image sensor according to claim 1 wherein said filter is arranged in a layer between said array of photodetectors and said one or more emitters.

4. The image sensor according to claim 1 further comprising a second filter for preventing light of said second wavelength from illuminating a surface on said first side of said array of photodetectors,
   wherein said array of photodetectors is arranged to detect reflections of light from said surface.

5. The image sensor according to claim 4 further comprising a transparent layer between said filters for directing light from said light source to said one or more emitters.

6. The image sensor according to claim 5 wherein said transparent layer acts as a spacer for spacing said array of photodetectors from said surface.

7. The image sensor according to claim 1 further comprising opaque covers for preventing light emitted from said one or more emitters from illuminating said array of photodetectors.

8. The image sensor according to claim 1 wherein said one or more emitters are printed on said filter and directed towards said first side of said array of photodetectors.

9. The image sensor according to claim 1 wherein light of said first wavelength is Infrared light, and light of said second wavelength is Ultraviolet light.

* * * * *